United States Patent
Tsou

(10) Patent No.: US 6,674,491 B2
(45) Date of Patent: Jan. 6, 2004

(54) METHOD FOR REDUCING THE ELECTROMAGNETIC IRRADIATION OF AN OSD SYSTEM

(75) Inventor: Hsien-Chun Tsou, Taoyuan Hsien (TW)

(73) Assignee: Benq Corporation, Taoyuan (TW)

( * ) Notice: Subject to any disclaimer, the term of this patent is extended or adjusted under 35 U.S.C. 154(b) by 455 days.

(21) Appl. No.: 09/809,658

(22) Filed: Mar. 15, 2001

(65) Prior Publication Data

US 2002/0018148 A1 Feb. 14, 2002

(30) Foreign Application Priority Data

Aug. 1, 2000  (TW) ........................................ 89115421 A

(51) Int. Cl.[7] .............................. H04N 5/65; G09G 5/02; H05K 9/00
(52) U.S. Cl. ........................ 348/819; 348/820; 345/699; 174/35 R
(58) Field of Search ................................. 348/819, 820; 345/698, 699; 361/150, 816, 818; 174/35 R, 51; H04N 5/65; G09G 5/02; H05K 9/00

(56) References Cited

U.S. PATENT DOCUMENTS

| | | | | |
|---|---|---|---|---|
| 5,036,216 A | * | 7/1991 | Hohmann et al. | 327/157 |
| 5,337,261 A | * | 8/1994 | Rogers | 702/190 |
| 5,528,268 A | * | 6/1996 | Ni et al. | 345/211 |
| 5,757,338 A | * | 5/1998 | Bassetti et al. | 345/3.2 |
| 5,818,171 A | * | 10/1998 | Kim et al. | 315/8 |
| 5,959,691 A | * | 9/1999 | Koh | 348/581 |
| 6,002,449 A | | 12/1999 | Tsyrganovich | |
| 6,020,939 A | * | 2/2000 | Rindal et al. | 348/805 |
| 6,255,830 B1 | * | 7/2001 | Rollin et al. | 324/627 |
| 6,396,486 B1 | * | 5/2002 | Kuo et al. | 345/700 |
| 2002/0196888 A1 | * | 12/2002 | Den Ouden | 375/371 |
| 2003/0058053 A1 | * | 3/2003 | Jeon et al. | 331/17 |

FOREIGN PATENT DOCUMENTS

| | | |
|---|---|---|
| DE | 690 33 160 | 1/2000 |
| EP | 0 393 352 | 6/1999 |

* cited by examiner

*Primary Examiner*—John Miller
*Assistant Examiner*—Brian Yenke
(74) *Attorney, Agent, or Firm*—Ladas & Parry

(57) ABSTRACT

The invention relates to a software method for reducing the electromagnetic irradiation of the Phase Lock Loop (PLL) within an On-Screen Display Menu system. The method includes the steps as follows: setting the resolution of an OSD system to a predetermined pass value of Electromagnetic Interference (EMI); checking the OSD system; changing the resolution of the OSD system to a value to be displayed if the OSD system is started; keeping on the predetermined value of EMI if the OSD system is not started; repeating the checking of the OSD system step.

8 Claims, 2 Drawing Sheets

METHOD FOR REDUCING THE ELECTROMAGNETIC IRRADIATION OF AN OSD SYSTEM

BACKGROUND OF THE INVENTION

1. Field of the Invention

The invention relates in general to a method for reducing the electromagnetic irradiation of a monitor. In particular, the invention relates to a software method for reducing the electromagnetic irradiation of the Phase Lock Loop (PLL) within an On-Screen Display Menu system.

2. Description of the Related Art

FIG. 1 is a typical response characteristic of an electromagnetic irradiation. In FIG. 1, a characteristic waveform depending on the frequency w can be represented by the function of f (w)=Asin (nwt), wherein A is the amplitude of the function, w is the frequency of the function, and n is the integer harmonic. The function can be further expanded as follows:

$$f(w)=A1 \sin(wt)+A2 \sin(2wt)+A3 \sin(3wt)+\ldots$$

The above equation, as shown in FIG. 1, is a frequency response with the harmonics incurred by a typical electromagnetic irradiation. Commonly, for a PLL circuit with an OSD system, the shown frequency of the electromagnetic irradiation is determined as set the resolution of the PLL circuit during the circuit layout. Typically, the exceeding electromagnetic irradiation appears on the positions of frequencies (Horizontal Resolution X Horizontal Frequency X n (n=2, 3, 4 . . . ) when the measurement of an OSD system. Particularly, the highest electromagnetic irradiation is easily created at the positions of n=2, 3, 4 . . . as shown in FIG. 1.

A manner for reducing the exceeding electromagnetic irradiation problem is to redesign the circuit layout or to add capacitor or inductor. No matter to redesign the layout or to add the element of capacitor or inductor could be causing the circuitry complexity, even incurring the noise interference from the added element. Another manner is to close the PLL OSC of the OSD system. However, the OSD system is often used with other circuits, such as with a Pulse Width Modulation (PWM) circuit for controlling the output power. To keep a normal operation in the whole system, therefore, the PLL OSC cannot be closed.

SUMMARY OF THE INVENTION

An object of the invention is to provide a software solution method for reducing electromagnetic irradiation, which adjusts the display resolution in order to avoid specific frequencies with the excess electromagnetic irradiation, thereby reducing the exceeding electromagnetic irradiation from the PLL OSC within the OSD system, and so it is unnecessary to redesign the circuit layout or to add new element for reducing the irradiation. The method includes the following steps: setting the resolution of an OSD system to a predetermined pass value of Electromagnetic Interference (EMI); checking the OSD system; changing the resolution of the OSD system to a value to be displayed if the OSD system is started; keeping on the predetermined value of EMI if the OSD system is not started; repeating from the checking the OSD system step.

As mentioned above, the software method of the present invention can easily determine the current resolution value without redesigning the circuit layout or adding an extra element. Thus, the excess irradiation of the OSD system is reduced and the PLL is operated at the normal frequency to keep the high resolution of the OSD system.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE PREFERRED EMBODIMENT

Figure 1:
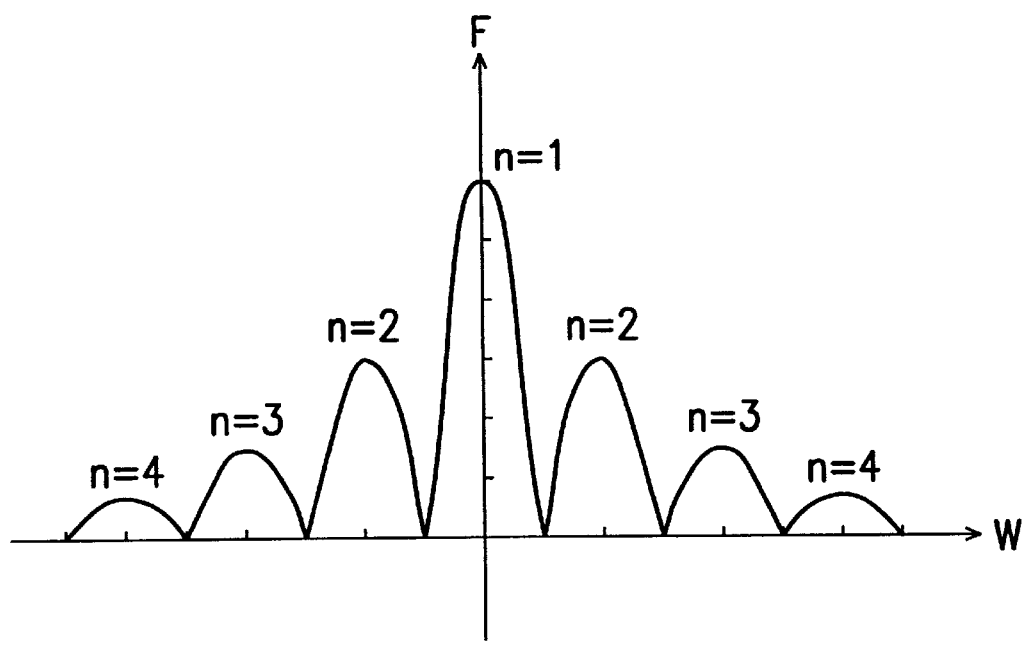
FIG. 1 shows a response characteristic of an electromagnetic irradiation.
Figure 2:
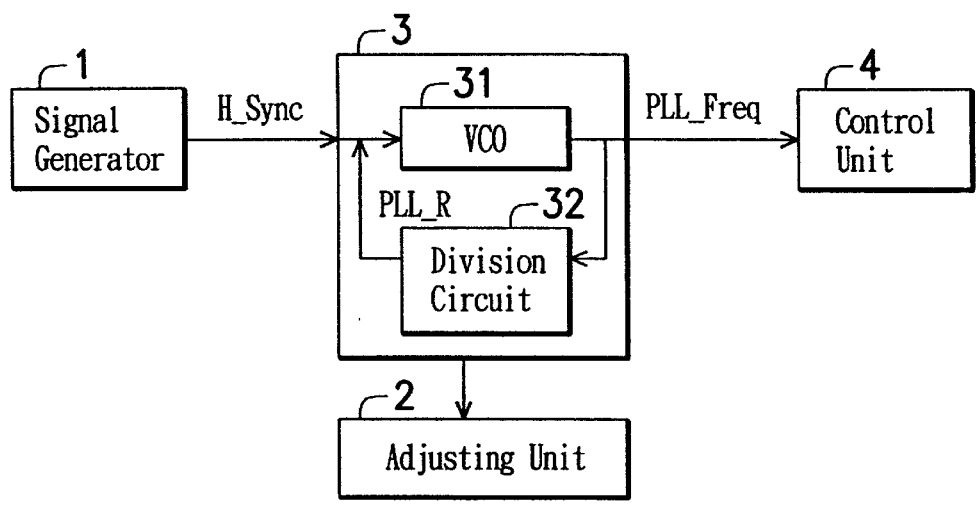
FIG. 2 is a block diagram of an OSD system with a PLL OSC.

Refer to FIG. 2, an OSD system with a PLL OSC. In FIG. 2, the OSD system includes a signal generator 1, an adjusting unit 2, a frequency generator 3, and a control unit 4. The frequency generator 3 further includes a voltage-controlled oscillator (VCO) 31 and a division circuit 32. As shown in FIG. 2, the signal generator 1 outputs a horizontally synchronous signal H_Sync to the VCO 31 to produce a frequency output PLL_Freq for the PLL circuit, for example 70 MHz. The output frequency PLL_Freq is divided by a desired resolution, for example 768, set by the software existing in the division circuit 32. The divided frequency PLL_R is fed back to the input of the VCO to control the output frequency PLL_Freq of the PLL within the VCO, for example the frequency PLL_Freq of 50 MHz. The frequency PLL_Freq is output to the control unit 4 for adjusting the circuit of the OSD. For example, the frequency waveform is dropped from 140 nm to 100 nm. The resolution set by the software can be stored in a programmable logic device (PLD) (not shown) of the adjusting unit 2, thereby changing the PLL frequencies (PLL frequency×n, n is integer) to be appeared into lower base frequencies or lower gain areas of the frequency response characteristic.

Figure 3:
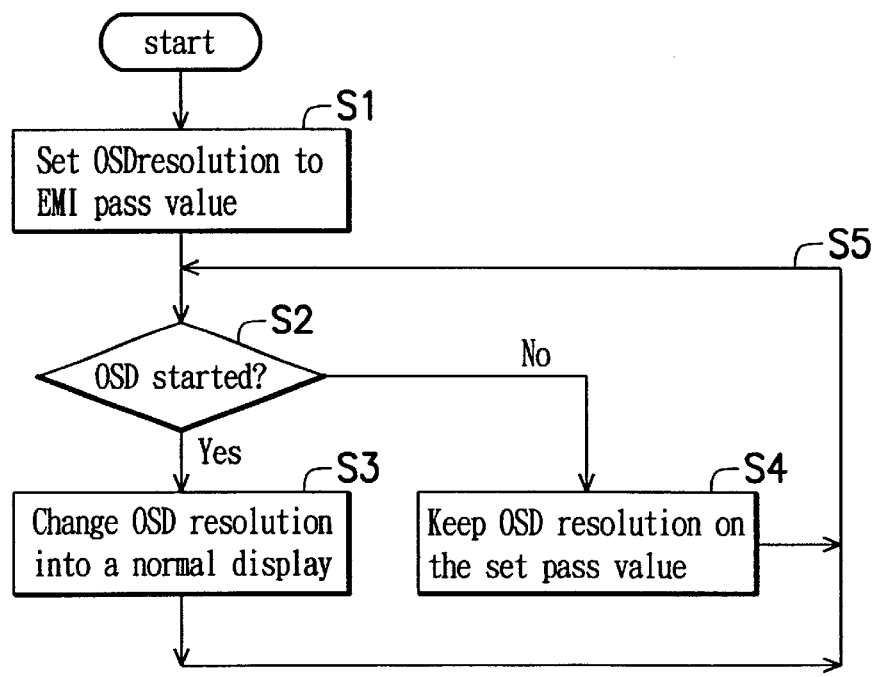
FIG. 3 shows a flowchart of the method for reducing the electromagnetic irradiation in accordance with the present invention.

FIG. 3 shows a flowchart of the method for reducing the electromagnetic irradiation in accordance with the present invention. In FIG. 3, the method includes the steps as follows: setting the resolution of an OSD system to a predetermined pass value of Electromagnetic Interference (EMI) (S1); checking the OSD system (S2); changing the resolution of the OSD system to a value to be displayed if the OSD system is started(S3); keeping on the predetermined value of EMI if the OSD system is not started (S4); repeating from the step S2 (S5).

As shown in FIG. 3, in step S1, the software first set the resolution of the OSD system to a predetermined value. The predetermined value can be randomly chosen but is necessary within a lower electromagnetic irradiation area. That is, the software makes the OSD system avoid from the highest electromagnetic irradiation area depending on the OSD circuit layout by setting the resolution of the OSD system to a pass value of the electromagnetic irradiation. The pass value is a standard value for measuring the EMI value of a monitor system including the OSD system, which falls on where the monitor system has a lower base frequency than others or on where a lower gain is shown in the monitor circuit. In other words, the set predetermined value of the resolution of the OSD system is put on a lower resolution at first. In step S2, checking the OSD system started or not is then performed. The step S4 for keeping on the lower resolution without changing is performed if the OSD system is not started. Otherwise, the resolution is changed to a normal level as usual in step S3, because the lower resolution can reduce the OSD display quality (including the resolution and display size of a font). Finally, because the started OSD system is an occasional event, checking back to see whether or not the OSD system is started in the last step (here, S5) is necessary, as shown in the flowchart of FIG. 3.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method for reducing the electromagnetic irradiation of an OSD system, comprising the steps:

setting a resolution of the OSD system to a predetermined pass value of Electromagnetic Interference (EMI);

checking the OSD system;

changing the resolution of the OSD system to a value to be displayed if the OSD system is started;

keeping on the predetermined value of EMI if the OSD system is not started; and repeating the checking of the OSD system step.

2. The method as claimed in claim 1, wherein the step of changing the resolution of the OSD system to a value to be displayed is performed by software for adjusting the resolution of the OSD system without reducing the display resolution quality of the OSD system.

3. The method as claimed in claim 1, wherein the value to be displayed is a normal resolution on a display dependent on the display used.

4. The method as claimed in claim 1, wherein the frequency of the electromagnetic interference shown depends on the circuit layout of the OSD system.

5. The method as claimed in claim 1, wherein the method is performed in the OSD system having a signal generator for producing a horizontally synchronous scan signal; an adjusting unit for setting a resolution; a frequency generator for receiving a signal from the signal generator and the adjusting unit for producing a PLL frequency; a control unit for receiving the PLL frequency from the frequency generator and adjusting an electromagnetic irradiation frequency of a monitor including the OSD system to a predetermined value.

6. The method as claimed in claim 5, wherein the resolution is set by a programmable device, which is any device with programming ability.

7. The method as claimed in claim 5, wherein the frequency generator further comprising a division circuit for dividing the input resolution from the adjusting unit; and an oscillator unit for receiving the horizontally synchronous scan signal from the signal generator and the output result from the division circuit, thereby producing the PLL frequency for adjusting the electromagnetic irradiation frequency.

8. The method as claimed in claim 7, wherein the input resolution is set by a programmable device, which is any device with programming ability.

* * * * *